(12) United States Patent
Takeda et al.

(10) Patent No.: US 8,525,259 B2
(45) Date of Patent: Sep. 3, 2013

(54) SEMICONDUCTOR DEVICE

(75) Inventors: Yasuhiro Takeda, Ogaki (JP); Kazunori Fujita, Yoro-gun (JP); Haruki Yoneda, Ogaki (JP)

(73) Assignees: Semiconductor Components Industries, LLC., Phoenix, AZ (US); SANYO Semiconductor Co., Ltd., Gunma (JP)

( * ) Notice: Subject to any disclaimer, the term of this patent is extended or adjusted under 35 U.S.C. 154(b) by 288 days.

(21) Appl. No.: 12/787,052

(22) Filed: May 25, 2010

(65) Prior Publication Data

US 2010/0301411 A1 Dec. 2, 2010

(30) Foreign Application Priority Data

May 29, 2009 (JP) ................... 2009-130736

(51) Int. Cl.
*H01L 29/78* (2006.01)
(52) U.S. Cl.
USPC ...... 257/339; 257/335; 257/343; 257/E29.256
(58) Field of Classification Search
USPC ............ 257/335–343, 487–496, E29.256, 257/E29.261; 438/404–413, 424–438
See application file for complete search history.

(56) References Cited

U.S. PATENT DOCUMENTS

| | | | |
|---|---|---|---|
| 5,258,636 A * | 11/1993 | Rumennik et al. | 257/339 |
| 5,534,721 A * | 7/1996 | Shibib | 257/339 |
| 6,043,532 A | 3/2000 | Depetro et al. | |
| 6,392,274 B1 * | 5/2002 | Tung | 257/339 |
| 6,593,621 B2 * | 7/2003 | Tsuchiko et al. | 257/335 |
| 6,867,100 B2 * | 3/2005 | Edwards et al. | 438/266 |
| 6,919,598 B2 * | 7/2005 | Hossain et al. | 257/328 |
| 7,195,965 B2 * | 3/2007 | Lin et al. | 438/202 |
| 7,323,747 B2 * | 1/2008 | Ikuta et al. | 257/343 |
| 7,420,255 B2 * | 9/2008 | Shimizu | 257/409 |
| 7,521,756 B2 * | 4/2009 | Dietz et al. | 257/335 |
| 7,521,758 B2 * | 4/2009 | Di Franco et al. | 257/336 |
| 7,737,494 B2 * | 6/2010 | Tanaka | 257/335 |
| 8,004,040 B2 * | 8/2011 | Ichijo et al. | 257/341 |
| 2009/0032870 A1 * | 2/2009 | Iida | 257/339 |
| 2009/0159967 A1 * | 6/2009 | Edwards et al. | 257/335 |
| 2011/0079849 A1 * | 4/2011 | Yan et al. | 257/343 |

FOREIGN PATENT DOCUMENTS

| | | |
|---|---|---|
| EP | 0841702 | 5/1998 |
| JP | 8-236754 | 9/1996 |
| JP | 10-233508 | 9/1998 |

* cited by examiner

Primary Examiner — Robert J Hoffberg
Assistant Examiner — Eric Ward
(74) Attorney, Agent, or Firm — Morrison & Foerster LLP

(57) ABSTRACT

The invention prevents a source-drain breakdown voltage of a DMOS transistor from decreasing due to dielectric breakdown in a portion of a N type drift layer having high concentration formed in an active region near field oxide film corner portions surrounding an gate width end portion. The field oxide film corner portions are disposed on the outside of the gate width end portion so as to be further away from a P type body layer formed in the gate width end portion by forming the active region wider on the outside of the gate width end portion than in a gate width center portion. By this, the N type drift layer having high concentration near the field oxide film corner portions are disposed further away from the P type body layer without increasing the device area.

6 Claims, 19 Drawing Sheets a=2.0E+16
b=1.0E+16
c=2.0E+15
d=1.0E+15

SEMICONDUCTOR DEVICE

CROSS-REFERENCE OF THE INVENTION

This application claims priority from Japanese Patent Application No. 2009-130736, the content of which is incorporated herein by reference in its entirety.

BACKGROUND OF THE INVENTION

1. Field of the Invention

The invention relates to a semiconductor device, in particular, a semiconductor device having a structure that enhances the breakdown voltage.

2. Description of the Related Art

A semiconductor device includes an LDMOS transistor. The DMOS is the abbreviation of a Double-Diffused Metal Oxide Semiconductor. A DMOS transistor in which an electric current flows in the lateral direction is the LDMOS transistor. The LD is the abbreviation of Laterally Diffused. The LDMOS transistor is widely used for a power supply circuit, a driver circuit and so on.

In a MOS transistor in which the source and drain layers containing a high concentration of impurities are formed near the gate channel layer, when a reverse bias is applied to the drain layer, a depletion layer extends from the drain layer into the semiconductor layer thereunder corresponding to the impurity concentration of the semiconductor layer. However, the depletion layer does not extend in the lateral direction from the drain layer near the gate channel layer into the semiconductor layer as the gate channel layer due to the effect of the electric field of the gate electrode and the drain layer. Therefore, since the electric field strength in the lateral direction of the drain layer is much larger than in the downward direction of the drain layer to cause dielectric breakdown, it is difficult to realize a high breakdown voltage MOS transistor.

This problem may be solved by increasing the thickness of the gate insulation film to weaken the electric field from the gate electrode. However, since the thickness of the gate insulation film is decreased according as the progress of the process technology, a so-called offset drain structure is used as a solution.

This is a structure in which a high concentration drain layer is disposed away from a gate channel layer. In this structure, a so-called drift layer of which the impurities is of the same type as that of the drain layer and the concentration is lower than that of the drain layer is formed between the gate channel layer and the high concentration drain layer, so that the depletion layer extends more easily from the high concentration drain layer in the lateral direction to decrease the electric field strength in the lateral direction and enhance the breakdown voltage.

The drift layer mentioned above fauns a path for an electric current between the source layer and the drain layer when the gate channel layer is inverted and the DMOS transistor turns on, and it is thus preferable for the drift layer to have as low resistance as possible. In other words, it is advantageous that the impurity concentration of the drift layer is higher since the on-resistance becomes lower. A tradeoff relation thus occurs between this and the effect described above that the impurity concentration of the drift layer is decreased to widen the depletion layer extending toward the drift layer in order to minimize the decrease of the breakdown voltage in the front surface and obtain a desired breakdown voltage.

Therefore, the impurity concentration of the drift layer need be determined without excess and deficiency in order to realize both the low on-resistance and high breakdown voltage appropriately, and some other factor may cause the decrease of the breakdown voltage. The inventors found that the decrease of the breakdown voltage occurs in a gate width end portion as described below even when the impurity concentration of the drift layer is determined appropriately from both the aspects of on-resistance and breakdown voltage. It is necessary to prevent the decrease of the breakdown voltage in the gate width end portion.

SUMMARY OF THE INVENTION

The invention provides a semiconductor device that includes a semiconductor layer of a first general conductive type, and an element isolation insulation layer formed on the semiconductor layer and defining an active region in plan view of the semiconductor layer. The active region is wider in a gate width end portion than in a gate width center portion in the plan view. The device also includes a body layer of a second general conductive type formed in the active region and comprising a channel region, a source layer of the first general conductive type formed in the body layer, a gate insulation film formed in the active region so as to cover the channel region, a gate electrode formed on the gate insulating film, a drift layer of the first general conductive type formed in the semiconductor layer, and a drain layer of the first general conductive type formed in the drift layer.

DETAILED DESCRIPTION OF THE INVENTION

Figure 1A:
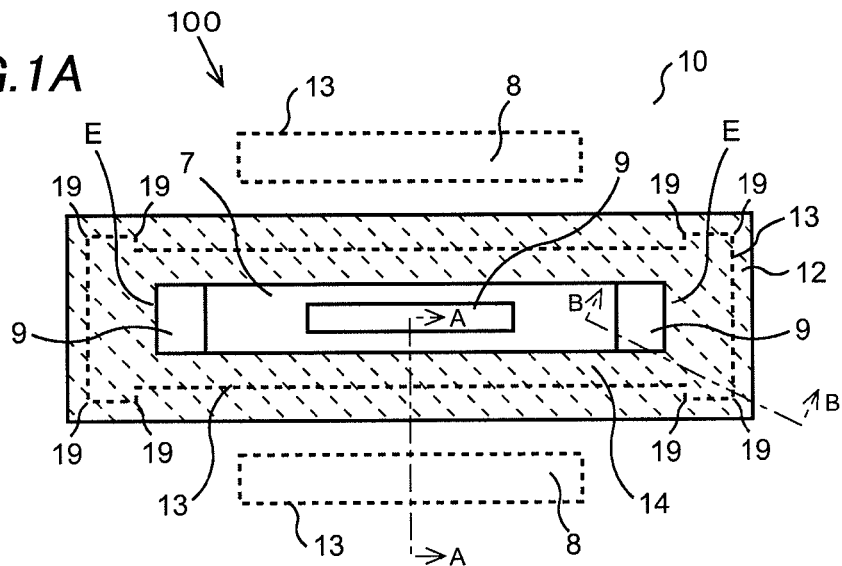
FIGS. 1A to 1C are a plan view and cross-sectional views of a DMOS transistor of a first embodiment of the invention.
Figure 1B:
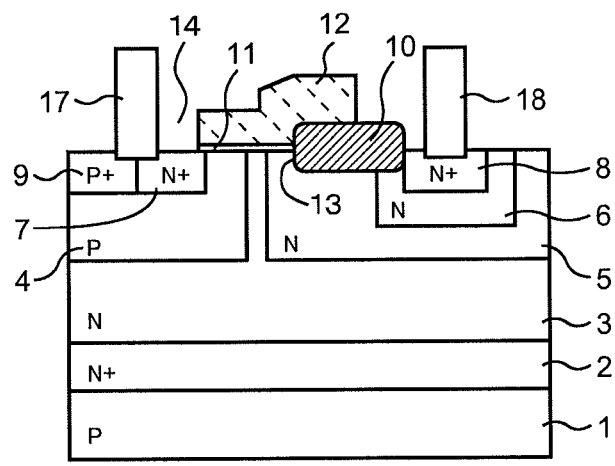
Figure 1C:
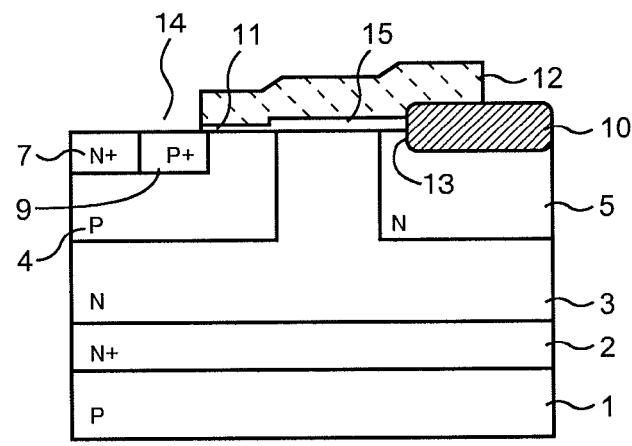

A DMOS transistor of a first embodiment of the invention will be described referring to FIGS. 1A to 2B. The DMOS transistor of the embodiment is a low voltage operating N channel type DMOS transistor (LDMOS transistor), and will be described as a DMOS transistor 100 hereafter. FIG. 1A is a plan view of the DMOS transistor 100 of the invention. The difference from a comparative example of FIG. 18A that will be described below is that a dotted line portion indicating a field oxide film end portion 13 is disposed further away from a gate width end portion E on the outside of the gate width end portion E. The gate width end portion E is the solid vertical line denoted by "E" in FIG. 1A, which corresponds to the inner and shorter edge portion of gate electrode 12. A field oxide film 10 is an element isolation film of LOCOS. In FIG. 1A, the field oxide film end portion 13 is disposed on the outside of the gate width end portion E so as to form a modified rectangular shape. A cross-sectional view of FIG. 1A along line A-A that is shown in FIG. 1B is the same as the comparative example. On the other hand, a cross-sectional view along line B-B that is shown in FIG. 1C is different from the comparative example, and the field oxide film end portion 13 and the N type drift layer 5 are disposed further away from a P type body layer 4. In other words, compared with the comparative example, field oxide film corner portions 19 are disposed further away from the P type body layer 4.

It is noted that conductivity types such as N+, N and N− belong in one general conductivity type and conductivity types such as P+, P and P− belong in the other general conductivity type.

As a method of disposing the field oxide film corner portions 19 further away from the P type body layer 4, there is a method in which an active region 14 is extended on the outside of the gate width end portion E so as to have the same width as the width of the active region 14 at the gate width center portion shown in FIG. 1A. In this case, the device size is increased to limit the miniaturization. Therefore, in the embodiment, the active region 14 on the outside of the gate width end portion E is formed in a modified rectangular shape having a larger width than in the gate width center portion, thereby obtaining a larger distance from the P type body layer 4 to the field oxide film corner portions 19 and preventing the increase of the device size.

Figure 2A:
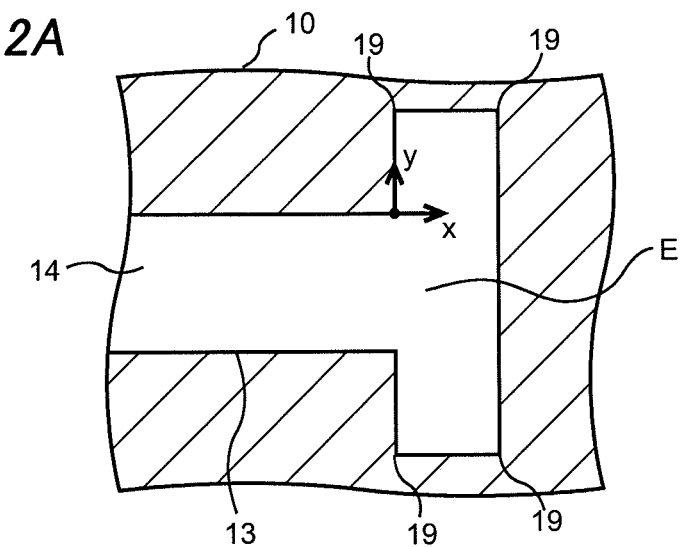
FIGS. 2A and 2B show a relation between a distance from a gate width end portion to a field oxide film end portion and a source-drain breakdown voltage in the DMOS transistor of FIGS. 1A to 1C.
Figure 2B:
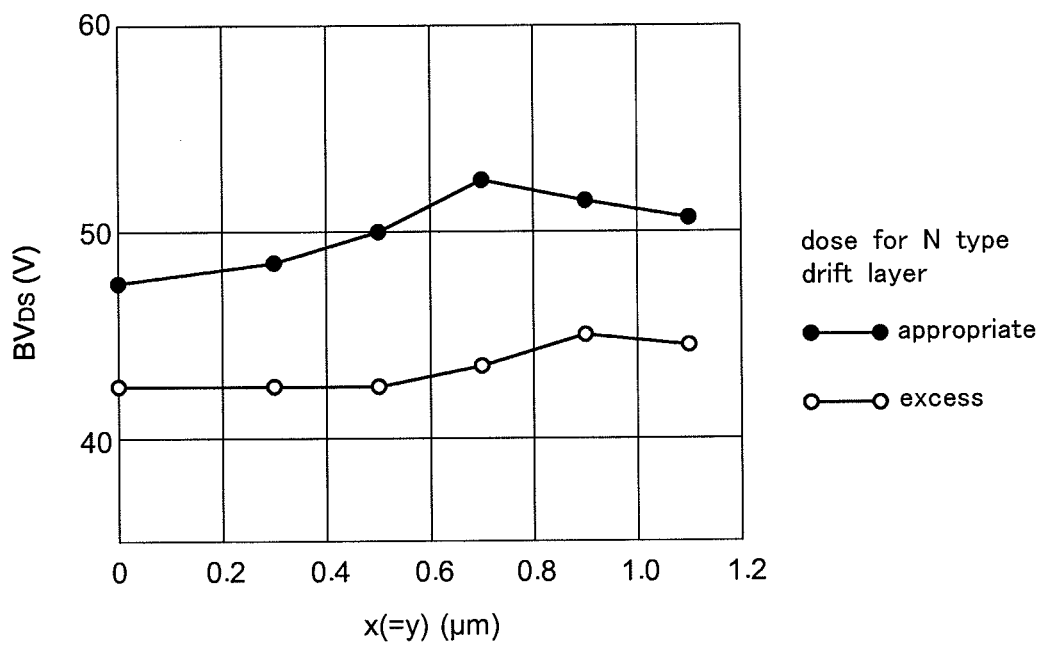

As a result, the P type body layer 4 is prevented from forming a PN junction directly with the N type drift layer 5 having high concentration that is formed in the active region 14 near the field oxide film corner portions 19, thereby decreasing the electric field strength and preventing the decrease of the source-drain breakdown voltage BVDS. It is proved from a study using the comparative example described below that the N type drift layer in the active region 14 near the field oxide film corner portions 19 has high concentration. FIG. 2A shows distances from a corner portion of the comparative example in x and y directions to dispose the field oxide film corner portions 19 further away from the gate width end portion E on the outside of the gate width end portion E. FIG. 2B shows a relation between the distance from the corner portion (x=0) of the comparative example to the field oxide film corner portion 19 and the value of the source-drain breakdown voltage BVDS.

Although it depends on the dose of phosphorus ion implantation for forming the N type drift layer 5, the source-drain breakdown voltage BVDS increases as x and y increase. In the embodiment, the case of x=y is shown. When the dose of ion implantation for forming the N type drift layer 5 is appropriate (●-●), BVDS is about 48 V when x=0, and the source-drain breakdown voltage BVDS increases until x=0.7 μm and is enhanced to about 52 V. When x is increased more, BVDS is recognized to decrease. This is conceivably caused by the gate electric field. This indicates that there is an optimum value for x. On the other hand, when the dose of ion implantation for forming the N type drift layer 5 is increased in excess of about 10% (○-○), the source-drain breakdown voltage BVDS decreases as a whole.

Although the active region 14 is extended on the outside of the gate width end portion E so as to have a modified rectangular shape in the embodiment, the invention is not limited to this and any shape is applicable as long as the N type drift layer 5 having high concentration formed near the field oxide film corner portions 19 is disposed further away from the P type body layer 4 formed in the gate width end portion E. Furthermore, in addition to this, it is also effective to form the field oxide film end portion 13 in a shape such that a high concentration region is not easily formed in the N type drift layer 5, for example, in a shape with no corner portion such as an arc or an oval.

Furthermore, in order to prevent the decrease of the breakdown voltage due to the insufficient extension of the depletion layer in the front surface of the P type body layer 4 due to the electric field between the gate electrode 12 formed on the front surface of the P type body layer 4 in the gate width end portion E with the gate insulation film 11 being interposed therebetween and two layers (the N type epitaxial layer 3 and the N type drift layer 5 having high concentration), it is effective to form the gate insulation film 11 so as to have a larger thickness than normal from on a portion of the front surface of the P type body layer 4 in the gate width end portion E to the field oxide film end portion 13. This is shown as a thick gate insulation film 15 in the cross-sectional view along line B-B in FIG. 1C. The effect of this increased thickness is shown when x=0 in FIG. 2B. When the dose for the N type drift layer 5 is appropriate, the figure indicates BVDS as 48 V as described above, while BVDS is about 40 V when the thickness is not increased. Therefore, BVDS is enhanced by about 8 V and the effect of the increased thickness is large.

This thick gate insulation film 15 is effective in other respect when the field oxide film end portion 13 is disposed largely away from the gate width end portion E on the outside of the gate width end portion E. In detail, when the field oxide film end portion 13 is disposed largely away from the gate width end portion E on the outside of the gate width end portion E, the proportion of the gate electrode 12 formed on the field oxide film 10 is decreased and the proportion of the gate electrode 12 directly formed on the gate insulation film 11 is increased. Then the insulation performance of the thin gate insulation film 11 under the gate electrode 12 may decrease due to etching damage or charge-up when the gate contact is formed, and thereby the breakdown voltage may decrease. Therefore, in this respect, too, there is an advantage in forming the gate insulation film 11 thick in this region as the thick gate insulation film 15.

Figure 3A:
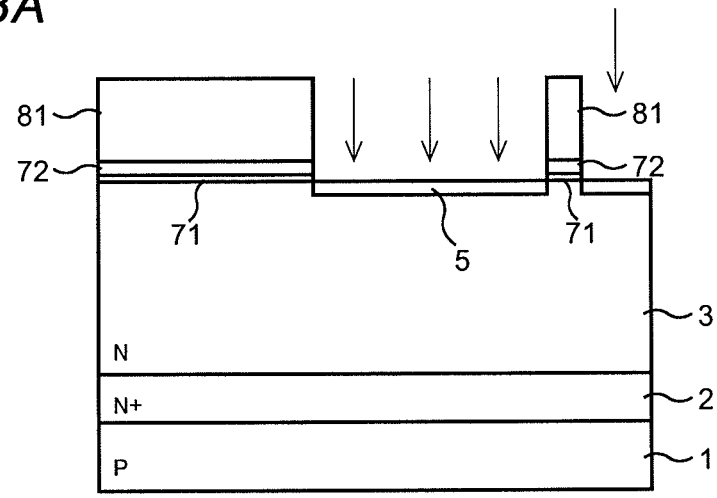
FIGS. 3A to 13B are cross-sectional views showing a method of manufacturing the DMOS transistor of the first embodiment of the invention.
Figure 3B:
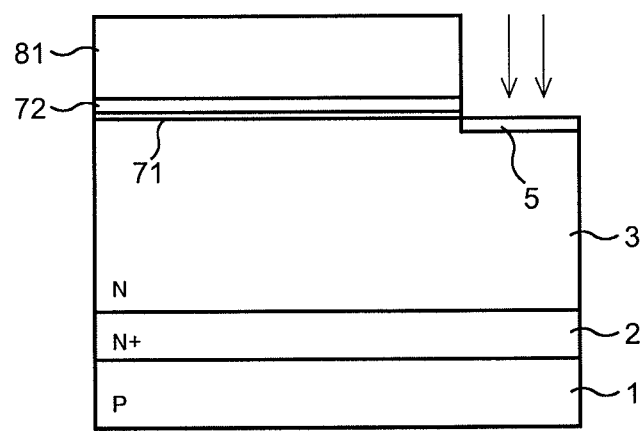

A method of manufacturing the DMOS transistor 100 of the first embodiment will be described referring to FIGS. 3A to 13B. In the figures, Figs. A show cross-sectional views of FIG. 1A along line A-A, and Figs. B show cross-sectional views along line B-B. First, as shown in FIGS. 3A and 3B, a P type semiconductor substrate 1 is provided, and N-type impurities such as antimony is introduced in a predetermined position of the front surface of the P type semiconductor substrate 1 by ion implantation, a spinning-on method or the like, and driven in at high temperature to form an N+ type embedded layer 2.

Then by a predetermined epitaxial process, the N type epitaxial layer 3 is deposited on the front surface of the semiconductor substrate 1 including the N+ type embedded layer 2. A thin oxide film 71 and a thin nitride film 72 are then formed on the front surface of the N type epitaxial layer 3 sequentially. A resist mask 81 is then formed by a predetermined process, the oxide film 71 and the nitride film 72 are etched, and phosphorus, arsenic or the like is ion-implanted in a predetermined region that is not covered by the resist mask 81 as shown by arrows in order to form the N type drift layer 5.

Figure 4A:
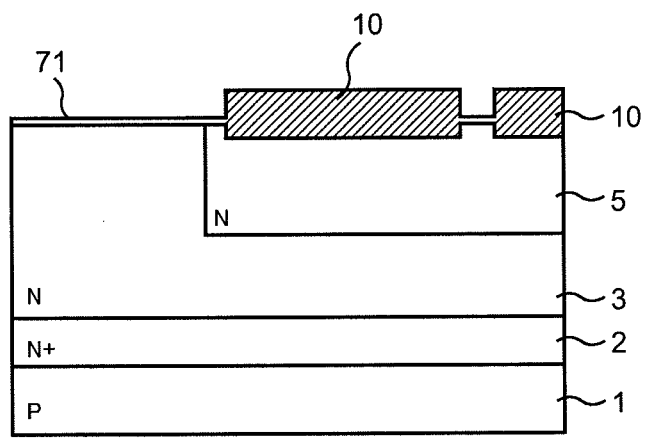
Figure 4B:
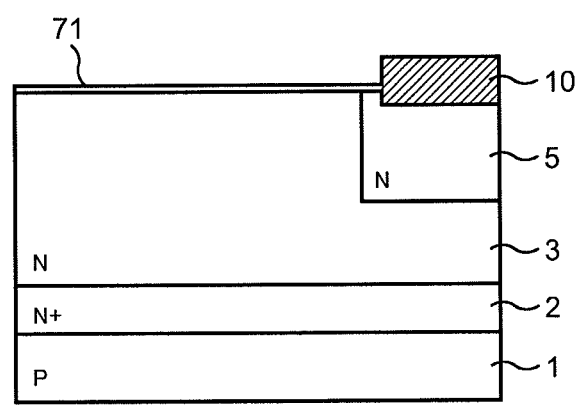

As shown in FIGS. 4A and 4B, the resist mask 81 is then removed and the field oxide film 10 is formed using the nitride film 72 as a mask in a high-temperature furnace. At this time, the N type drift layer 5 ion-implanted is diffused deeply in the N type epitaxial layer 3 as shown in FIGS. 4A and 4B.

As shown in FIGS. 4A and 4B, the N type drift layer 5 is diffused downward from the field oxide film 10 and also in the lateral direction, extending to a portion of the N type epitaxial layer 3 that is to be the active region 14 on the outside of the field oxide film 10. This extending portion from the field oxide film 10 is to form the N type drift layer 5 having high concentration in the active region 14 near the field oxide film corner portions 19 as described above. Then the nitride film 72 is removed.

Figure 5A:
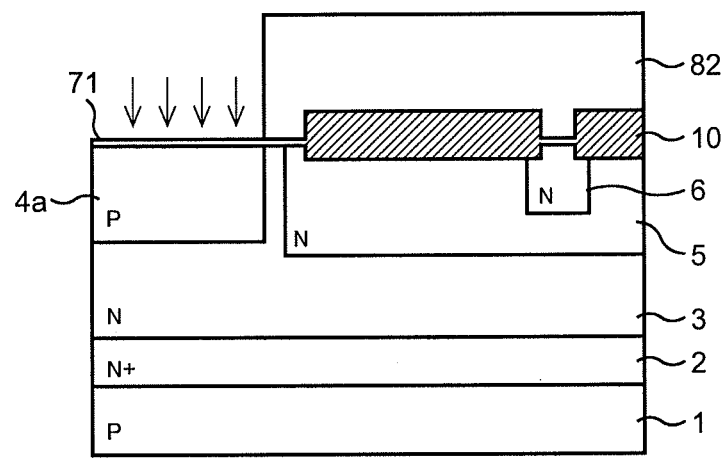
Figure 5B:
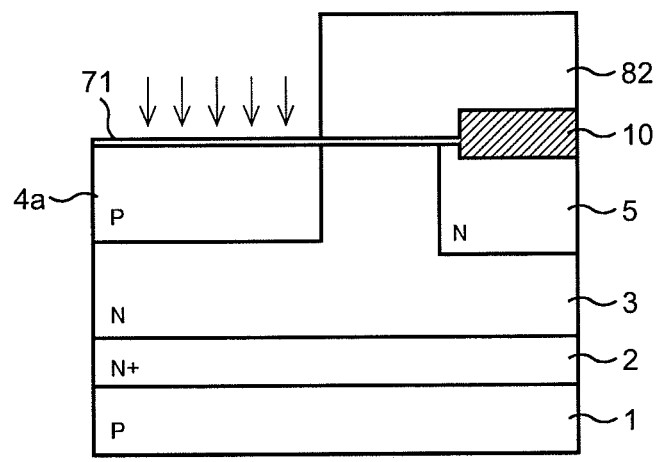
Figure 6A:
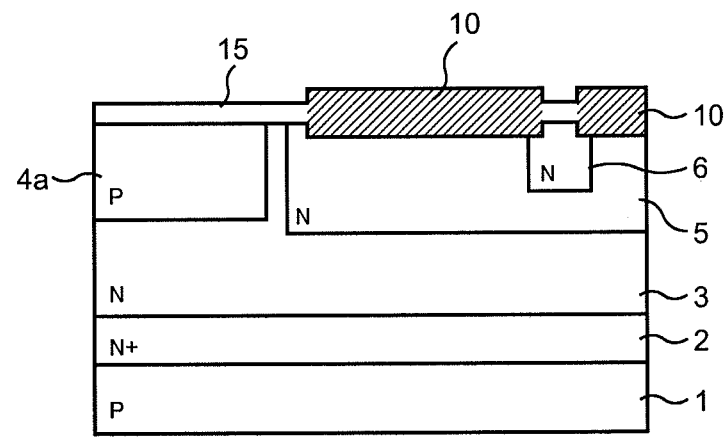
Figure 6B:
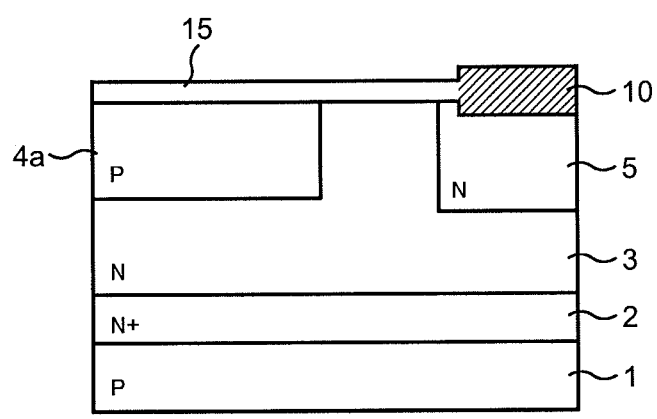

As shown in FIGS. 5A and 5B, a resist mask 82 is then formed by a predetermined method, and boron or the like is ion-implanted in the N type epitaxial layer 3 through the oxide film 71 to form a low concentration P type body layer 4a. The low concentration P type body layer 4a is formed in order to secure the source-drain breakdown voltage BVDS. Furthermore, an N type well layer 6 shown in FIG. 5A is formed by ion implantation of phosphorus or the like using a resist or the like (not shown) as a mask. As shown in FIGS. 6A and 6B, the resist mask 82 and the oxide film 71 are then removed and the thick gate insulation film 15 is formed.

This is to decrease the electric field strength between the gate electrode 12 and the N type epitaxial layer 3 or the N type drift layer 5 so as to secure the extension of the depletion layer toward the P type body layer 4 and prevent the decrease of the source-drain breakdown voltage BVDS in the front surface. The forming of the thick gate insulation film 15 is achieved without increasing the number of manufacturing processes by simultaneously performing this in the process of forming a gate insulation film 15 of a DMOS transistor 200 that will be described below.

Figure 7A:
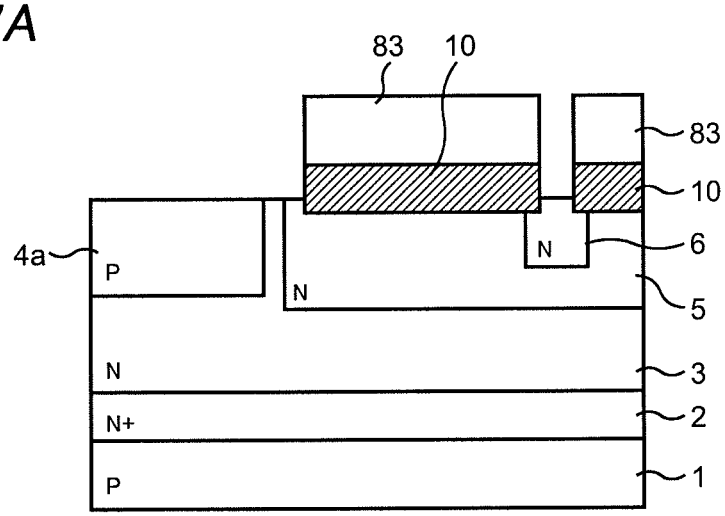
Figure 7B:
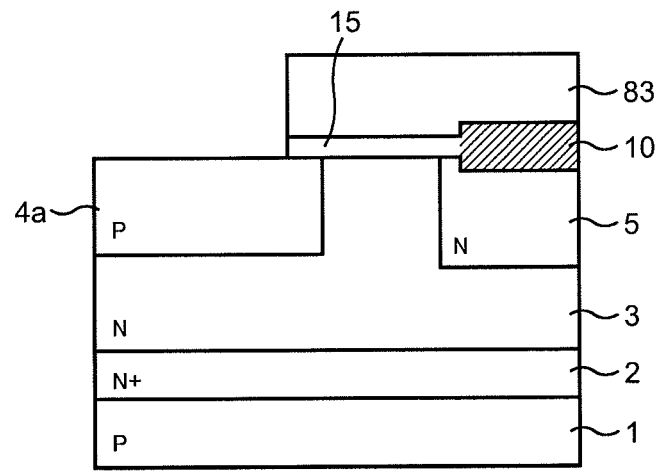
Figure 8A:
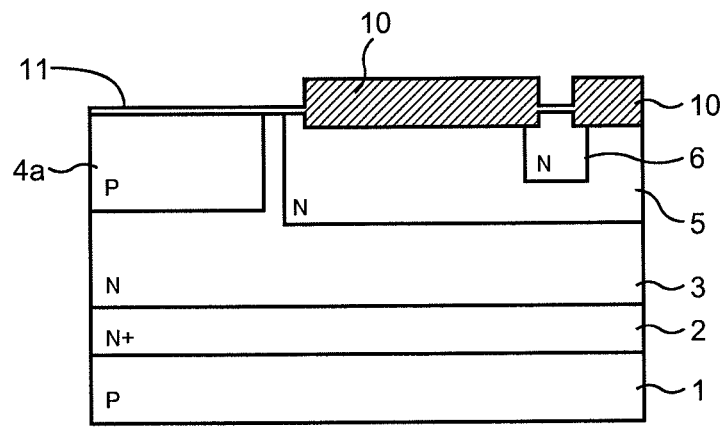
Figure 8B:
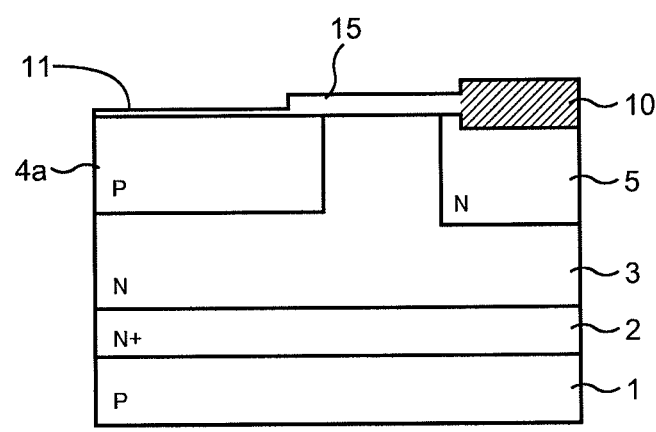

As shown in FIGS. 7A and 7B, a resist mask 83 is then formed and the thick gate insulation film 15 is selectively etched so as to remain from on the P type body layer 4a and so on in the gate width end portion E to the field oxide film 10. As shown in FIGS. 8A and 8B, the resist mask 83 is then removed and the gate insulation film 11 is formed by thermal oxidation.

Figure 9A:
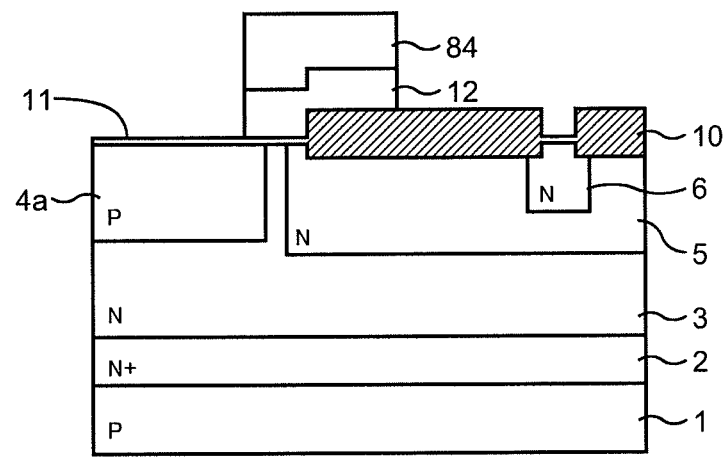
Figure 9B:
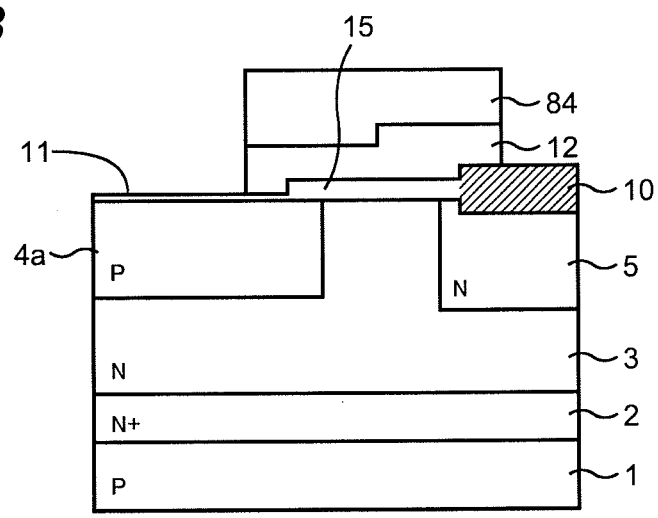

As shown in FIGS. 9A and 9B, polysilicon is then deposited on the whole surface by a CVD method, a resist mask 84 is formed, and then the polysilicon is etched to form the gate electrode 12. Normally, after the polysilicon is deposited, phosphorus or the like is introduced in the polysilicon in a high-temperature furnace or by ion implantation.

Figure 10A:
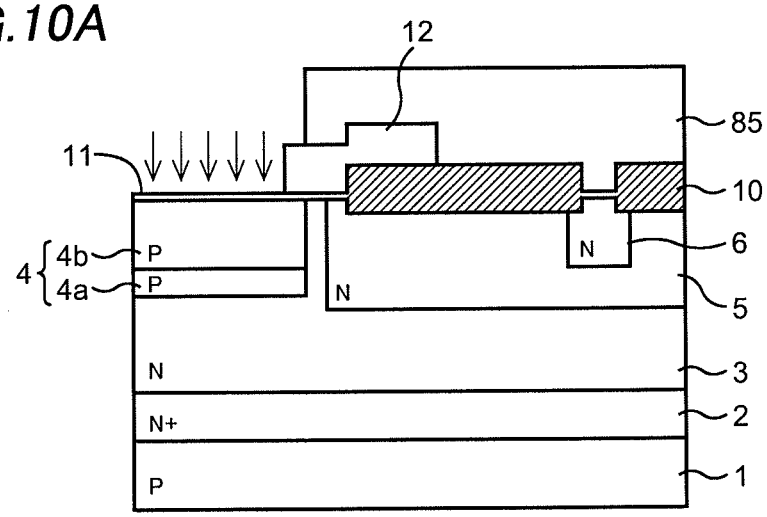
Figure 10B:
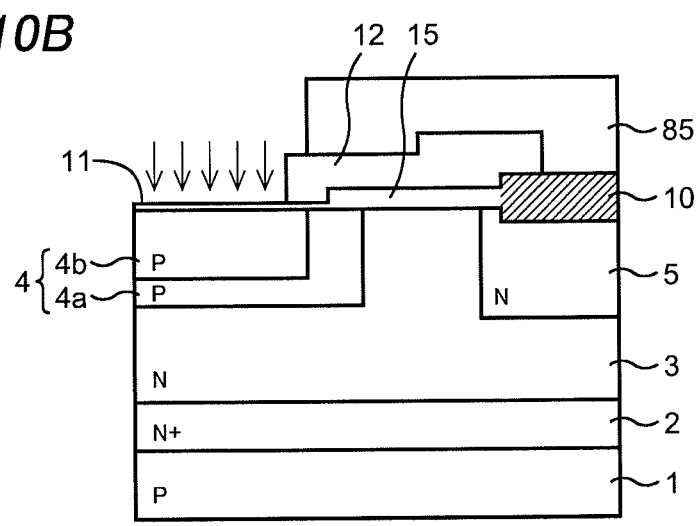

As shown in FIGS. 10A and 10B, the resist mask 84 is then removed, a resist mask 85 is formed, a second P type body layer 4b of which the concentration is higher than that of the first P type body layer 4a is formed in the P type body layer 4a by ion implantation using the resist mask 85 and the gate electrode 12 as a mask. This P type body layer 4b is to adjust the threshold voltage. Hereafter, the description will be given referring the P type body layers 4a and 4b as a P type body layer 4.

Figure 11A:
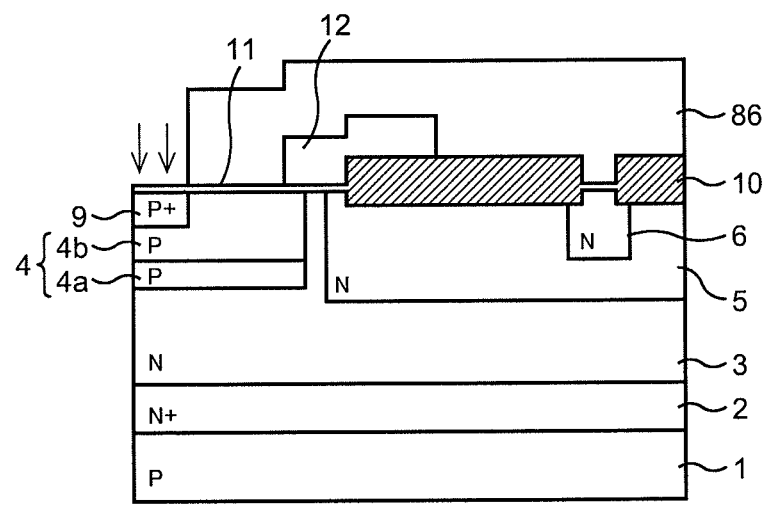
Figure 11B:
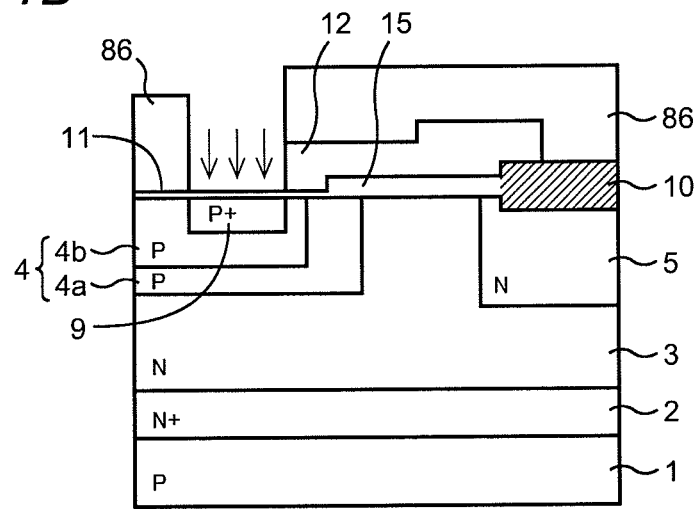

As shown in FIGS. 11A and 11B, P+ type contact layers 9 are formed by ion implantation of a high concentration of boron or the like using a resist mask 86.

Figure 12A:
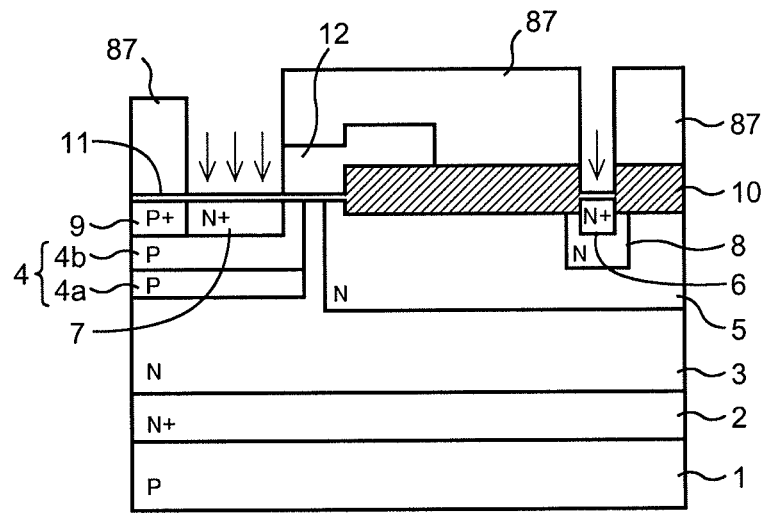
Figure 12B:
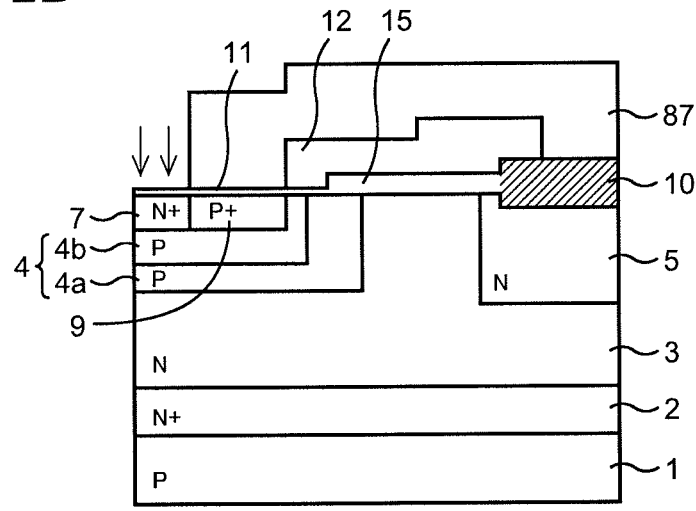

As shown in FIGS. 12A and 12B, after the resist mask 86 is removed, a resist mask 87 is formed and a high concentration of arsenic or the like is ion-implanted to form an N+ type source layer 7 and an N+ type drain layer 8 in the P type body layer 4 and in the N type well layer 6 of the N type drift layer 5 respectively. The P+ type contact layer 9 is formed inside the N+ type source layer in the gate center portion shown in FIG. 12A, while the P+ type contact layers 9 are formed on the outside of the N+ type source layer 7 on the gate width end portion E side. In the gate width end portion E, the P+ type contact layer 9 functions as an anti-inversion layer. Furthermore, the N+ type source layer 7 and the P+ type contact layer 9 are connected through a source electrode 17 that will be described below and have the same potential. Therefore, the P type body layer 4 is fixed to the source potential.

Figure 13A:
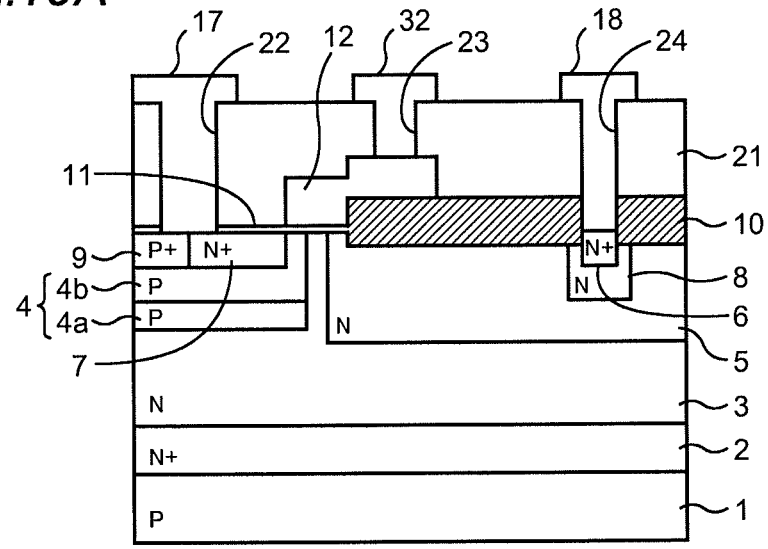
Figure 13B:
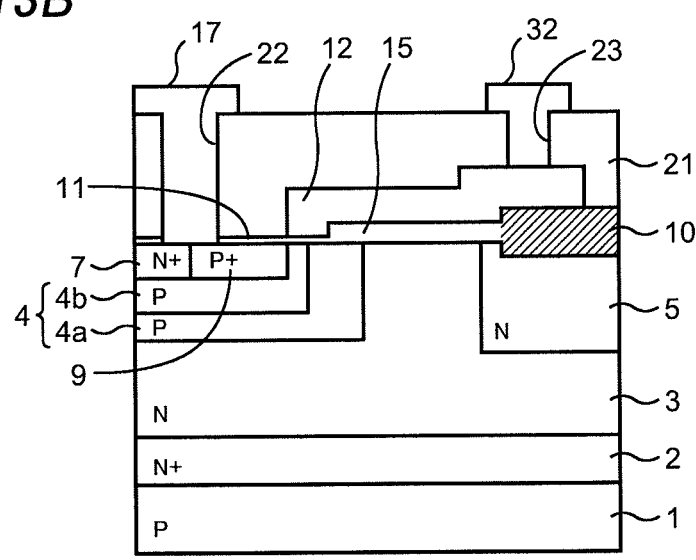

As shown in FIGS. 13A and 13B, the resist mask 87 is then removed, and an interlayer insulation film 21 such as BPSG is deposited and contact holes 22, 23 and 24 are formed. Then aluminum or the like is deposited therein, and the source electrode 17, a drain electrode 18 and a gate extraction electrode 32 are formed by a predetermined photo-etching process. Finally, the whole front surface of the semiconductor substrate 1 where the source electrode 17 and so on are formed is covered by a protection film (not shown), thereby completing the DMOS transistor 100 of which the source-drain breakdown voltage BVDS is enhanced. The source-drain breakdown voltage BVDS is enhanced by about 8 V by the thickened gate insulation film, and further enhanced by about 4 V, thereby about 12 V in total, by disposing the field oxide film end portion 13 further away from the gate width end portion E on the outside of the gate width end portion E.

The reason for providing the first embodiment of the invention will be described hereafter referring to a comparative example. A high breakdown voltage MOS transistor (a DMOS transistor 300) having an offset drain structure in which an N type drift layer 5 surrounding a P type body layer 4 is disposed under a field oxide film 10 similarly surrounding the P type body layer 4 including a channel layer cannot have enough breakdown voltage although the impurity concentration of the N type drift layer 5 is determined appropriately from the aspects of on-resistance and breakdown voltage. As a result of cause analysis, it was found that the breakdown voltage decreases in a gate width end portion. A phenomenon such that light emission occurs in an active region 14 near field oxide film corner portions 19 and the breakdown voltage decreases in that portion was found.

Figure 18A:
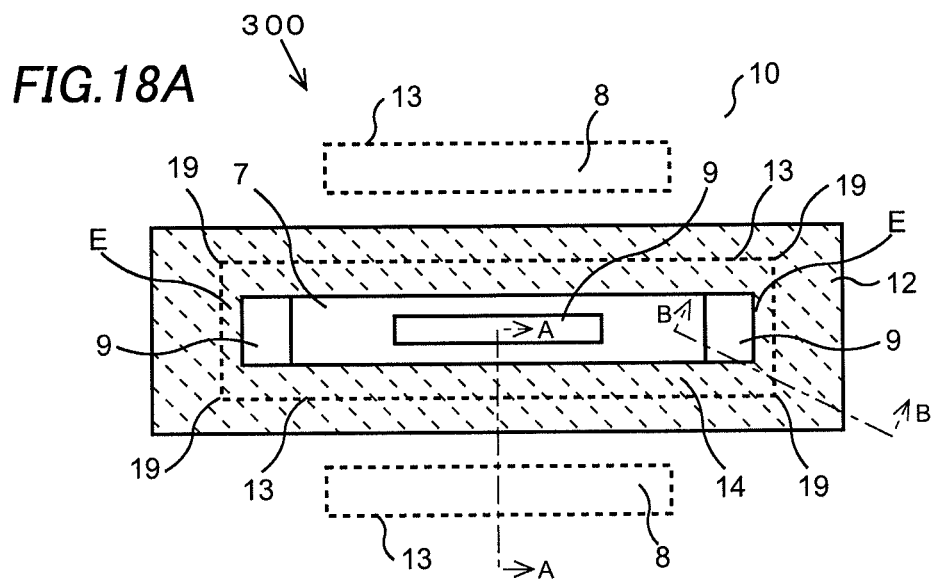
FIGS. 18A to 18C are a plan view and cross-sectional views showing a DMOS transistor as a comparative example.
Figure 18B:
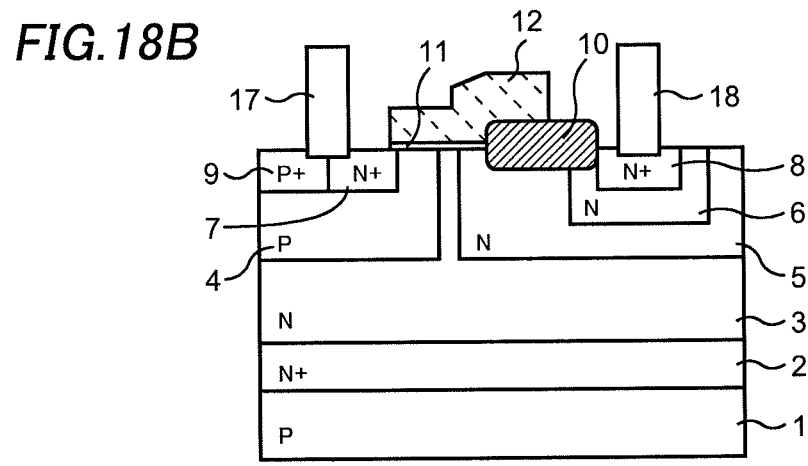
Figure 18C:
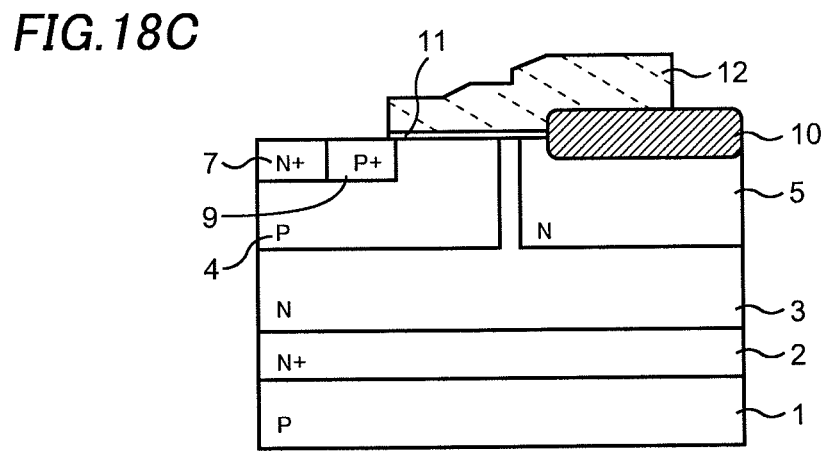

The cause will be described hereafter referring to FIGS. 18A, 18B and 18C with the comparative example of which the breakdown voltage decreases in the gate width end portion mentioned above. FIG. 18A is a plan view of the DMOS transistor 300 as the comparative example. FIG. 18B is a cross-sectional view of the plan view along line A-A, and FIG. 18C is a cross-sectional view along line B-B. An N+ type embedded layer 2 is formed on the front surface of a P type semiconductor substrate 1, and an N type epitaxial layer 3 is deposited thereon. The P type body layer 4 including the channel layer and the N type drift layer 5 are formed on the front surface of the N type epitaxial layer 3. An N+ type source layer 7 and a P+ type contact layer 9 are formed on the front surface of the P type body layer 4. An N type well layer 6 is further formed on the front surface of the N type drift layer 5, and an N+ type drain layer 8 is formed on the front surface of the N type well layer 6.

Furthermore, a gate electrode 12 is formed so as to extend from on the end portion of the N+ type source layer 7 or the end portion of the P+ type contact layer 9 with a gate insulation film 11 being interposed therebetween onto the field oxide film 10. A source electrode 17 and a drain electrode 18 are formed on the N+ type source layer 7 and so on and on the N+ type drain layer 8, respectively. A portion of the front surface of the P type body layer 4, that is in contact with the gate insulation film 11 between the N+ type source layer 7 and the N type epitaxial layer 3 in FIG. 18B, is the channel layer. The corresponding portion of the P type body layer 4 shown in FIG. 1B is the channel layer of the device of the first embodiment.

A portion shown by a dotted line in FIG. 18A corresponds to a field oxide film end portion 13, and a portion inside the portion surrounded by the dotted line corresponds to the active region 14 where the N+ type source layer 7 and so on and the N+ type drain layer 8 are formed. The P type body layer 4 (not shown) is formed under the gate electrode 12 between the N type source layer 7 and so on and the field oxide film end portion 13 shown by the dotted line with the gate insulation film 11 being interposed therebetween so as to surround the N type source layer and so on. Furthermore, the N type drift layer 5 (not shown) is formed under the field oxide film 10 surrounding the P type body layer 4 so as to surround the P type body layer 4, having a diffusion layer end portion inside the active region 14 from the field oxide film end portion 13. FIGS. 18B and 18C show this structure.

The field oxide film 10 is formed in the other region than the active region 14 surrounded by the field oxide film end portion 13 shown by the dotted line. In the gate width end portion E in FIG. 18A, the field oxide film end portion 13 is formed to have an almost U shape having the field oxide film corner portions 19. The P type body layer 4 and the N type drift layer 5 (not shown) are also formed to have an almost U shape surrounding the P+ type contact 9 functioning as an anti-inversion layer formed in both the end portions of the N type source layer 7.

When the source-drain breakdown voltage BVDS of the DMOS transistor 300 having this structure is checked in the state where the gate electrode 12 is grounded, light emission is recognized in a portion of the active region 14 near the field oxide film corner portions 19 mentioned above. The P type body layer 4 near the corner portions also has the corner portions, and the radius of curvature decreases according as the progress of the process technology, and thereby the PN junction breakdown voltage naturally decreases compared with that in the linear portion. Apart from this, the inventor focuses on the concentration in the front surface of the N type drift layer 5 diffused in the active region 14 from the field oxide film 10 near the corner portions, and calculates the impurity concentration of phosphorus in this portion.

Figure 19A:
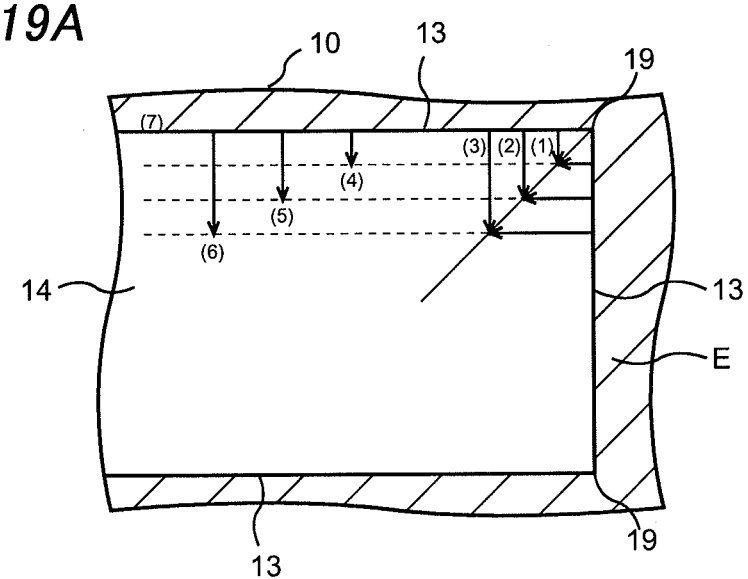
FIGS. 19A to 19C are views showing a distribution of phosphorus concentration in the active region in the gate width end portion and gate center region of the DMOS transistor as the comparative example.

FIG. 19A shows the positions in the active region 14 where the phosphorus concentration is calculated. The phosphorus concentration is checked in the positions (1) to (3) in the gate width end portion E, in the positions (4) to (6) that are away from the gate width end portion, and in the position (7) immediately under the field oxide film 10 for comparison. The phosphorus concentration in the positions (4) to (6) depends on the phosphorus diffusion from the lateral field oxide film end portion 13 as shown by arrows, and hardly depends on the phosphorus diffusion from the vertical field oxide film end portion 13 in the gate width end portion E as shown in FIG. 19A. The phosphorus concentration in the position (7) depends on the phosphorus diffusion from the front surface to the inside in this position.

On the other hand, the phosphorus concentration in the positions (1) to (3) depends on the phosphorus diffusion from both the lateral and vertical field oxide film end portions 13 in the gate width end portion E as shown by arrows in FIG. 19A. In the case of the position (1), since the position is 0.25 µm away from both the lateral and vertical field oxide film end portions 13, it is estimated that the phosphorus concentration in this position is approximately twice the phosphorus concentration in the position (4) that is 0.25 µm away from the lateral field oxide film end portion 13. Therefore, the phosphorus concentration in the position (1) conceivably corresponds to a value calculated in a pseudo manner in which phosphorus diffusion sources under the field oxide film end portions 13 that correspond to diffusion sources are disposed on the left and right sides of the position (1) indicated by a dotted line as shown in FIG. 19B.

Figure 19B:
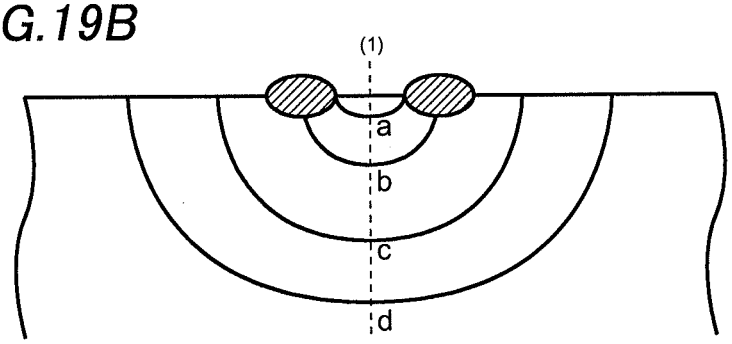
Figure 19C:
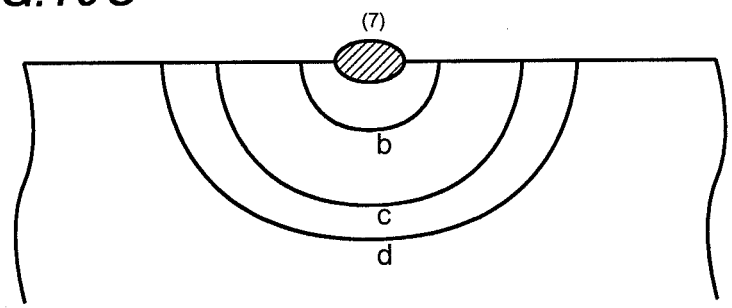

FIG. 19B shows a distribution of phosphorus concentration obtained by values calculated from the front surface in the depth direction of the active region 14 in the position (1) indicated by the dotted line. The concentration at the most front surface is $2.06 \times 10^{16} \mathrm{cm}^{-3}$. In the similar manner, the concentration in the position (2) is $1.96 \times 10^{16} \mathrm{cm}^{-3}$ and the concentration in the position (3) is $1.87 \times 10^{16} \mathrm{cm}^{-3}$. Thus the phosphorus concentration decreases as the distance from the field oxide film corner portion 19 increases. Furthermore, as to the front surface concentration in the positions (4) to (6) that are away from the vertical field oxide film end portion 13 in the gate width end portion E, by the lateral field oxide film end portion 13 at the beginning of the arrows that serves as a diffusion source shown in FIG. 19A, the concentration in the position (4) is $1.12 \times 10^{16} \mathrm{cm}^{-3}$, the concentration in the position (5) is $1.07 \times 10^{16} \mathrm{cm}^{-3}$, and the concentration in the position (6) is $9.99 \times 10^{15} \mathrm{cm}^{-3}$, and the distribution of the phosphorus concentration is slightly more than a half of the front surface concentration in the positions (1) to (3) near the gate width end portion E respectively. The distributions of the phosphorus concentration in the positions (4) to (7) after diffused are similar since the lateral field oxide film end portion 13 functions as a diffusion source. The distribution of phosphorus concentration in the position (7) is representatively shown in FIG. 19C.

Since the phosphorus concentration is $1.27 \times 10^{16} \mathrm{cm}^{-3}$ in the position (7) immediately under the field oxide film 10, the front surface concentration of $2.06 \times 10^{16} \mathrm{cm}^{-3}$ in the position (1) is 1.62 times higher than the front surface concentration in the position (7) immediately under the field oxide film 10. Therefore, in the N type drift layer 5 having high front surface concentration, that is formed in the active region 14 near the field oxide film corner portions 19, and in the PN junction formed in the P type body layer 4 in the gate width end portion E, the depletion layer does not extend more easily than in the PN junction in the gate width center portion, and it was found that this causes the decrease of the source-drain breakdown voltage BVDS.

The decrease of the breakdown voltage in the gate width end portion E is prevented by disposing the N type drift layer 5 having high front surface concentration in the active region 14 near the field oxide film corner portions 19 further away from the P type body layer 4 in the gate width end portion E. The first embodiment of the invention is provided from this aspect.

Figure 14A:
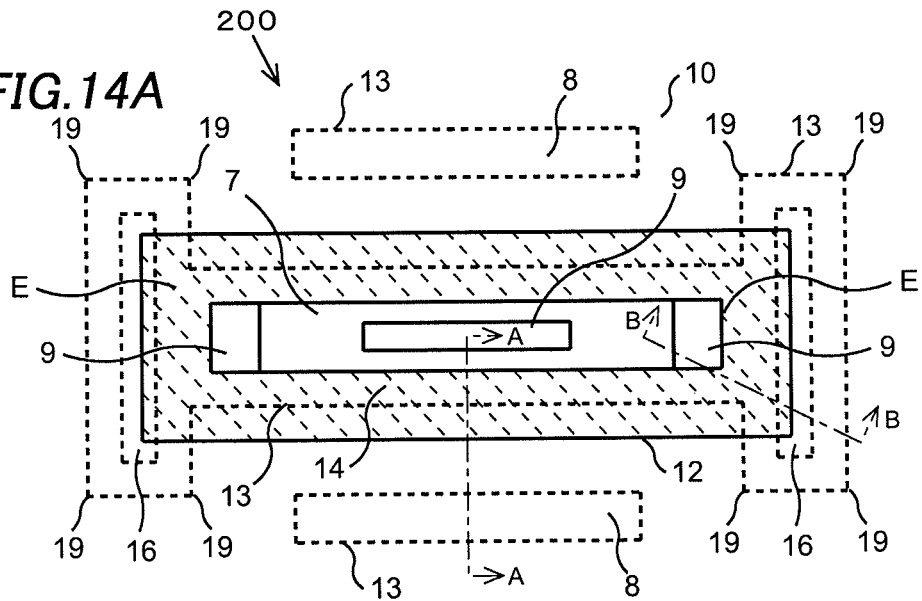
FIGS. 14A to 14C are a plan view and cross-sectional views showing a DMOS transistor of a second embodiment of the invention.
Figure 14B:
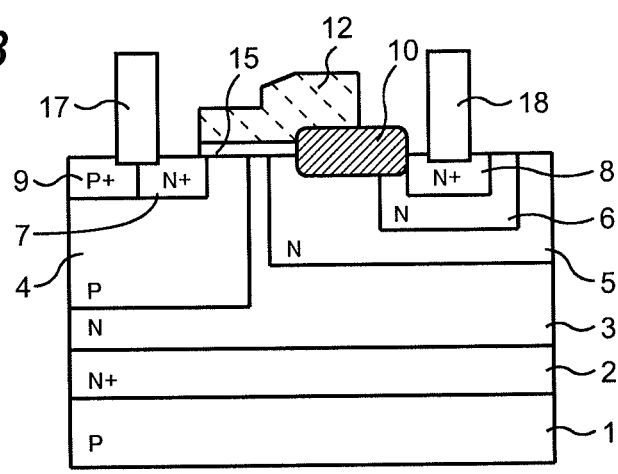
Figure 14C:
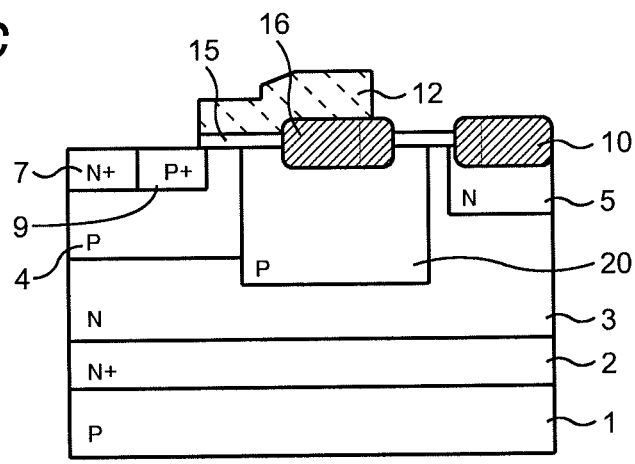

A DMOS transistor of a second embodiment is a high voltage operating N channel type DMOS transistor (an HMOS transistor), in which the same high voltage as that for the drain electrode is applied to the gate electrode. Hereafter, the description will be given referring to this transistor as a DMOS transistor 200 and referring to FIGS. 14A, 14B, 14C, 15A and 15B. The DMOS transistor 200 also basically has the same structure as that of the normal DMOS transistor 100. FIG. 14A is a plan view of the DMOS transistor 200. FIG. 14B is a cross-sectional view of the plan view of FIG. 14A along line A-A, and FIG. 14C is a cross-sectional view along line B-B. The same numerals are given to the same components as those of the first embodiment.

The major difference from the DMOS transistor 100 shown in FIG. 1 is that as shown in FIGS. 14B and 14C the gate insulation film 15 is thick, the distance from the P type body layer 4 in the gate width end portion E to the field oxide film end portion 13 disposed away from the gate width end portion E on the outside of the gate width end portion E is larger, the field oxide film end portion 13 is disposed further away on the outside of the gate electrode 12, a gate electrode mounting insulation film 16 is further formed in the active region 14 where the field oxide film does not exist between the field oxide film end portion 13 disposed largely away from the gate width end portion E and the gate width end portion E, and a P type electron accumulation prevention layer 20 as a diffusion layer extended to the P type body layer 4 is formed under the gate electrode mounting insulation film 16.

Therefore, the cross-sectional view of FIG. 14A along line A-A shown in FIG. 14B is not so apparently different from the case of the DMOS transistor 100 in FIG. 1B, and only the gate thickness, the front surface concentration of the P type body layer 4 and the diffusion depth are different. However, the cross-sectional view along line B-B shown in FIG. 14C is largely different from the case of the DMOS transistor 100 in FIG. 1B. As shown in FIG. 14A, the second embodiment is similar to the first embodiment in that the breakdown voltage is enhanced by disposing the field oxide film corner portions 19 largely away from the P type body layer 4 in the gate width end portion E by disposing the field oxide film end portion 13 largely away from the gate width end portion E on the outside of the gate width end portion E. However, since the field oxide film end portion 13 is disposed largely away from the gate width end portion E on the outside of the gate width end portion E, this increases the proportion of the gate electrode 12 directly formed on the gate insulation film 15 instead of formed on the field oxide film 10.

In a subsequent process, in the similar manner to the process shown in FIGS. 13A and 13B, the interlayer insulation film 21 is formed on the gate electrode 12 and the gate contact 23 is formed in the interlayer insulation film 21 formed on the gate electrode 12. Since a dry-etching such as RIE is normally used for this process, the gate insulation film 15 immediately under the gate electrode 12 may be damaged during the etching and the insulation performance of the gate insulation film 15 may be degraded. Therefore, as shown in FIGS. 14A and 14C, the thick gate electrode mounting insulation film 16 is formed in order to mount the gate electrode 12 that extends from on the P+ type contact layer 9 in the gate width end portion E with the gate insulation film 15 being interposed therebetween, and thereby the gate insulation film 15 is prevented from being damaged during the etching for forming the gate contact.

In the DMOS transistor 100, a problem does not occur when the gate voltage is applied to the gate electrode 12 that extends from the gate width end portion E onto the field oxide film 10 since the gate voltage is about 3 to 5 V. However, in the DMOS transistor 200, since the gate voltage is high, i.e., 50 V that is the same as the drain voltage, the electric field from the gate electrode effects in the front surfaces of the N type epitaxial layer 3 and the N type drift layer 5 that are in contact with the gate insulation film 15 and the field oxide film 10 shown in FIG. 15A to easily form an electron accumulation layer, and thus the depletion layer does not extend well.

Figure 15A:
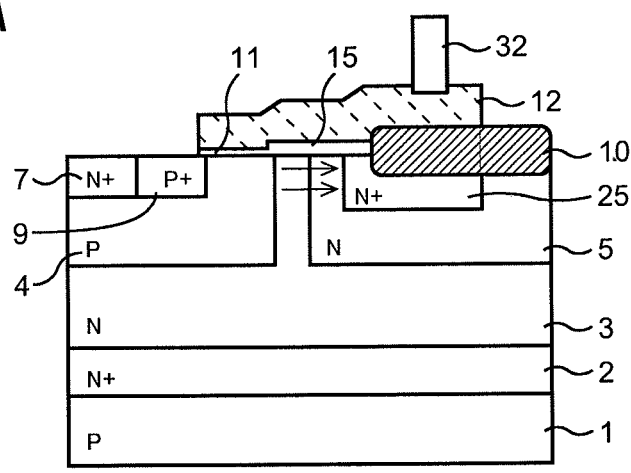
FIGS. 15A and 15B are cross-sectional views showing a solution for the decrease of the source-drain breakdown voltage in the gate width end portion of the DMOS transistor of the second embodiment of the invention.

Nevertheless the depletion layer extends as shown by the arrows in the lateral direction shown FIG. 15A as the source-drain apply voltage VDS increases, but it stops at an N+ type accumulation layer 25 formed in the front surface of the N type drift layer 5 immediately under the field oxide film 10 and so on, the electric field strength increases, and the source-drain breakdown voltage BVDS decreases. The concentration of the N+ type accumulation layer 25 gradually decreases toward the drain having high potential, and gradually increases toward the P type body layer 4 having low potential on the contrary.

Figure 15B:
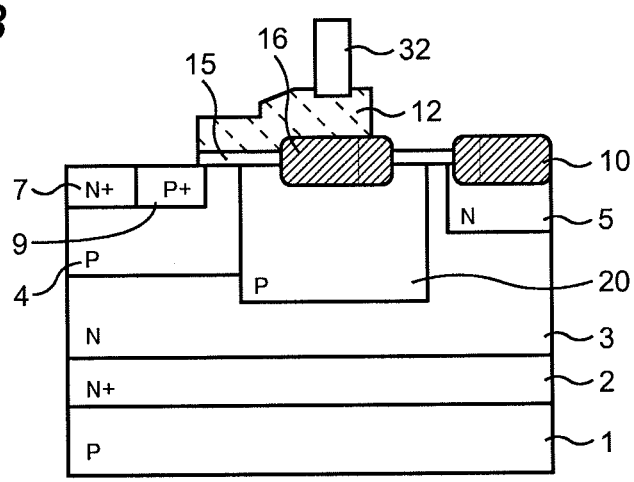

In the case where the gate electrode mounting insulation film 16 is formed in order to solve the damage and so on when the gate contact is formed, too, if the gate electrode mounting insulation film 16 is formed directly on the N type epitaxial layer 3 and the gate electrode 12 is formed thereon, an N+ type accumulation layer 25 is also formed in the front surface of the N type epitaxial layer 3 as described above and the source-drain breakdown voltage BVDS still decreases. Therefore, the P type electron accumulation prevention layer 20 is previously formed immediately under the gate electrode mounting insulation film 16 so as to abut the P type body layer 4 as shown in FIG. 15B, thereby preventing the forming of the N+ type accumulation layer 22 and the decrease of the breakdown voltage.

With this structure, since the P type electron accumulation prevention layer 20 is formed by diffusing ion-implanted P-type impurities prior to the forming of the gate electrode mounting insulation film 16, it abuts the P type body layer 4 and is also diffused toward the N type drift layer 5 to decrease the front surface concentration of the high concentration N type drift layer 5 near the field oxide film corner portions 19. Furthermore, since it has lower concentration than that of the P type body layer 4, the depletion layer easily extends. Furthermore, since the gate electrode mounting insulation film 16 on the P type electron accumulation prevention layer 20 is much thicker than the gate insulation film 15, the electric field strength of the gate electrode 12 decreases and thus the extension of the depletion layer from the N type epitaxial layer 2 toward the P type electron accumulation prevention layer 20 becomes large. Therefore, this structure contributes largely to the achievement of a higher breakdown voltage DMOS transistor 200.

Figure 16A:
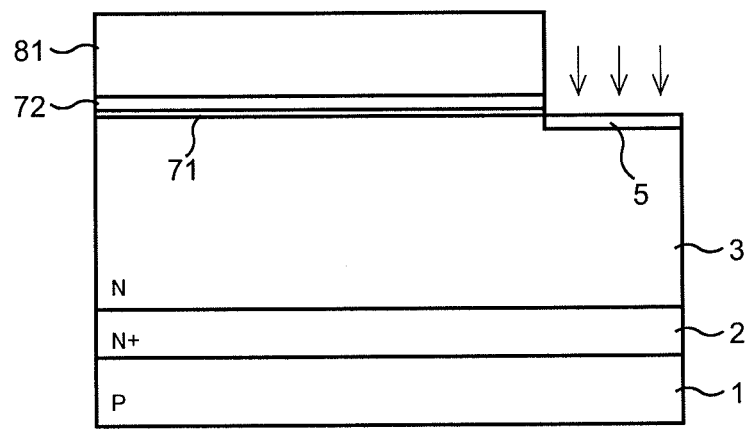
FIGS. 16A to 17B are cross-sectional views showing a method of manufacturing the DMOS transistor of the second embodiment of the invention.

A method of manufacturing the DMOS transistor 200 of the second embodiment will be described referring to FIGS. 16A, 16B, 17A and 17B. The method of forming the gate electrode mounting insulation film 16 and the P type electron accumulation prevention layer 20 under gate electrode mounting insulation film 16 that are the differences from the first embodiment will be mainly described. First, FIG. 16A shows a cross-sectional view of the gate width end portion E that corresponds to the cross-sectional view of FIG. 14A along line B-B. FIG. 16A shows the state where the N type drift layer 5 is formed on the N type epitaxial layer 3 by ion implantation of phosphorus or the like using the resist mask 81 in the similar manner to that shown in FIG. 3B in the first embodiment.

Figure 16B:
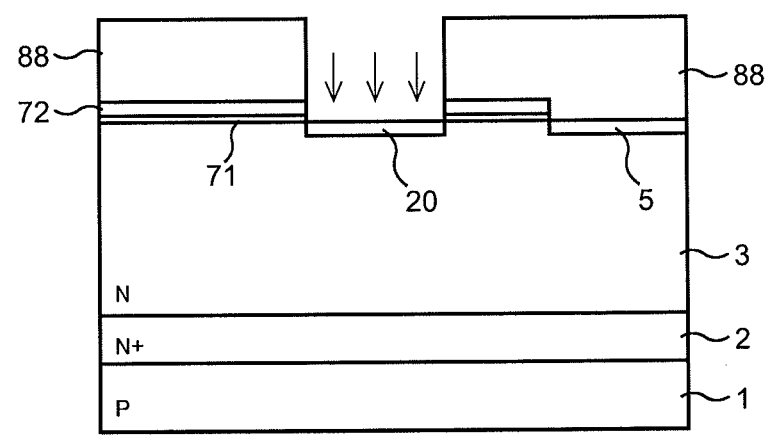

In a different manner from the first embodiment, as shown in FIG. 16B, a resist mask 88 is then formed and boron or the like is ion-implanted in a predetermined region to form the P type electron accumulation prevention layer 20. The process of ion implantation of boron or the like using the resist mask 88 as a mask does not provide an additional process since this process is performed in a process that is usually performed in order to prevent the inversion of the P type layer under the field oxide film into N type.

Figure 17A:
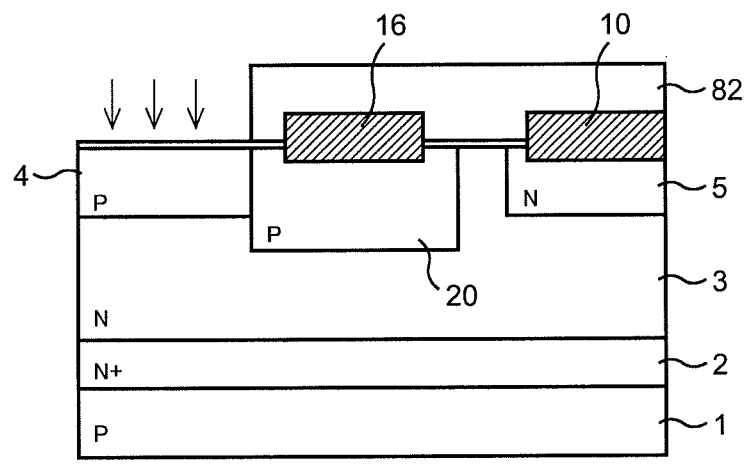

As shown in FIG. 17A, the resist 88 is then removed and the gate electrode mounting insulation film 16 and the field oxide film 10 are formed using the nitride film 72 as a mask. By the heat treatment performed for forming the field oxide film 10 and so on, the N type drain layer 5 and the P type electron accumulation prevention layer 20 are diffused deeply in the N type epitaxial layer 3.

Figure 17B:
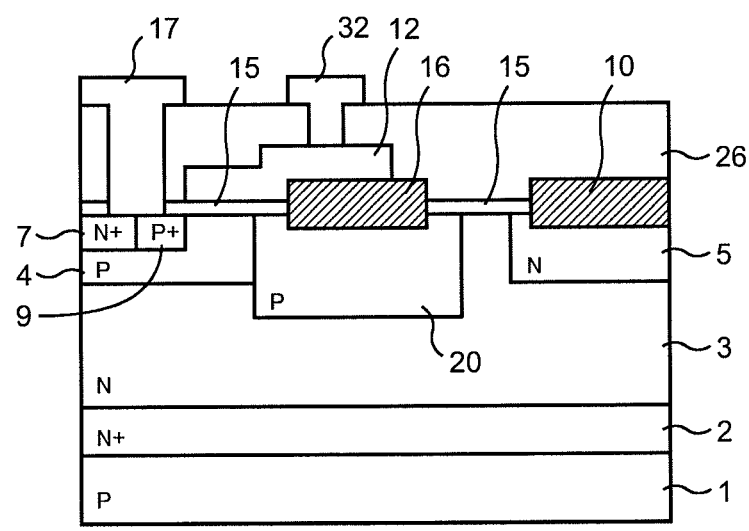

Then the P type body layer 4 is formed in a predetermined region by ion implantation of boron or the like using the resist mask 82. Then by the same processes as in the first embodiment, the DMOS transistor 200 having the gate insulation film 15 that is thicker than the gate insulation film 11 of the first embodiment, the gate electrode mounting insulation film 16 and so on is completed as shown in FIG. 17B.

Although the embodiments are described about a DMOS transistor, the invention is not limited to this and other device is applicable as long as the technical concept is unchanged.

The invention prevents the decrease of a breakdown voltage in the gate width end portion of a semiconductor device and realizes a DMOS transistor having a desired breakdown voltage.

What is claimed is:

1. A semiconductor device comprising:
    a semiconductor layer of a first general conductive type;
    an element isolation insulation layer formed on the semiconductor layer and having an opening in plan view of the semiconductor layer, an inner edge of the opening in the element isolation insulation layer defining an active region in the plan view, and the active region being wider in a gate width end portion than in a gate width center portion in the plan view;
    a body layer of a second general conductive type formed in the active region and comprising a channel region;
    a source layer of the first general conductive type formed in the body layer;
    a gate insulation film formed in the active region so as to cover the channel region;
    a gate electrode formed on the gate insulating film;
    a drift layer of the first general conductive type formed in the semiconductor layer; and
    a drain layer of the first general conductive type formed in the drift layer,
    wherein the inner edge of the opening in the element isolation insulation layer includes a corner portion in the plan view.

2. The semiconductor device of claim 1, wherein the drift layer is disposed under the element isolation insulation layer so as to surround the body layer in the plan view, and the gate electrode extends outside the active region so as to be on the element isolation insulation layer.

3. The semiconductor device of claim 1, wherein the gate insulation film is thicker in the gate width end portion and on an outside of the gate width end portion than in the gate center portion.

4. The semiconductor device of claim 1, wherein the gate electrode surrounds the source layer in the plan view.

5. The semiconductor device of claim 4, further comprising a gate electrode mounting insulation layer disposed in the active region between the gate width end portion and a lateral edge of the element isolation insulation layer in the plan view, a contact layer of the second general conductivity type formed between the source layer and the gate electrode mounting insulation layer, and an electron accumulation prevention layer of the second general conductive type disposed under the gate electrode mounting insulation layer, wherein the gate electrode extends so as to be on the gate electrode mounting insulation layer.

6. The semiconductor device of claim 1, further comprising a contact layer of the second general conductivity type, wherein the contact layer is divided into at least two portions by the source layer in the plan view.

* * * * *